United States Patent [19]
Takiguchi et al.

[11] Patent Number: 5,771,257
[45] Date of Patent: Jun. 23, 1998

[54] LIGHT ABSORPTION MODULATOR AND INTEGRATED SEMICONDUCTOR LASER AND MODULATOR

[75] Inventors: Tohru Takiguchi; Eitaro Ishimura, both of Tokyo, Japan

[73] Assignee: Mitsubishi Denki Kabushiki Kaisha, Tokyo, Japan

[21] Appl. No.: 774,018

[22] Filed: Dec. 26, 1996

[51] Int. Cl.⁶ .............................. H01S 3/19; H01S 3/10; G02F 1/03; G02F 1/01

[52] U.S. Cl. .............................. 372/50; 359/248; 372/26; 385/1; 385/2

[58] Field of Search ................................. 372/50, 45, 26; 359/248, 245; 385/14, 131, 1, 2

[56] References Cited

U.S. PATENT DOCUMENTS

| | | | |
|---|---|---|---|
| 5,084,894 | 1/1992 | Yamamoto | 372/50 |
| 5,131,060 | 7/1992 | Sakata | 382/2 |
| 5,436,195 | 7/1995 | Kimura et al. | 437/129 |
| 5,519,721 | 5/1996 | Takano | 372/50 |
| 5,528,413 | 6/1996 | Ishimura | 359/248 |
| 5,572,616 | 11/1996 | Aoki et al. | 385/131 |

OTHER PUBLICATIONS

Devaux et al., "InGaAsP/InGaAsP Multiple–Quantum–Well Modulator With Improved Saturation Intensity And Bandwidth Over 20 GHz", IEEE Photonics Technology Letters, vol. 4, No. 7, 1992, pp. 720–723 (Jul. 1992).

Aoki et al., "InGaAs/InGaAsP MQW Electroabsorption Modulator Integrated With A DFB Laser Fabricated By Band–Gap Energy Control Selective Area MOCVD", IEEE Journal of Quantum Electronics, vol. 29, No. 6, 1993, pp. 2088–2096 (Jun. 1993).

Primary Examiner—Rodney B. Bovernick
Assistant Examiner—Luong-Quyen T. Phan
Attorney, Agent, or Firm—Leydig, Voit & Mayer, Ltd.

[57] ABSTRACT

A light absorption modulator includes a semiconductor substrate of a first conductivity type; a first cladding layer of the first conductivity type disposed on the substrate; an optical waveguide disposed on the first cladding layer and including a multiple quantum well optical waveguide layer through which light travels and first and second light confinement layers respectively disposed on opposed surfaces of the optical waveguide layer to confine light in the optical waveguide layer; and a second cladding layer of a second conductivity type, opposite the first conductivity type, disposed on the optical waveguide, one of the first and second cladding layers being n type, the one of the first and second light confinement layers that contacts the n type cladding layer being p type, and light traveling through the optical waveguide layer being modulated by applying an electric field to the optical waveguide layer. The electric field strength in the multiple quantum well optical waveguide layer when no reverse bias is applied to the modulator is reduced, whereby the rise time of the optical output from the modulator is reduced.

4 Claims, 13 Drawing Sheets

Fig.3 (a)
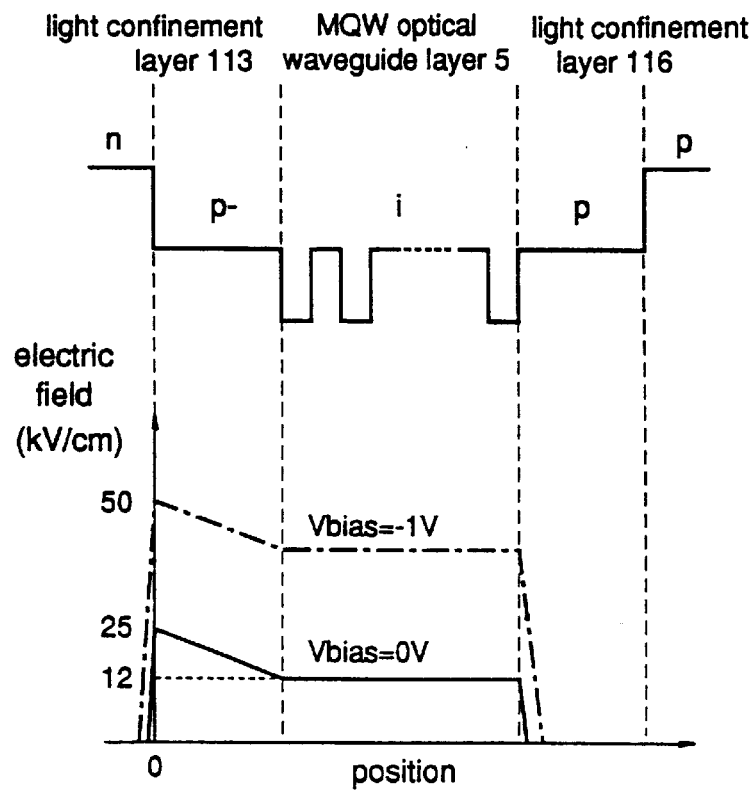
Fig.3 (b) Prior Art
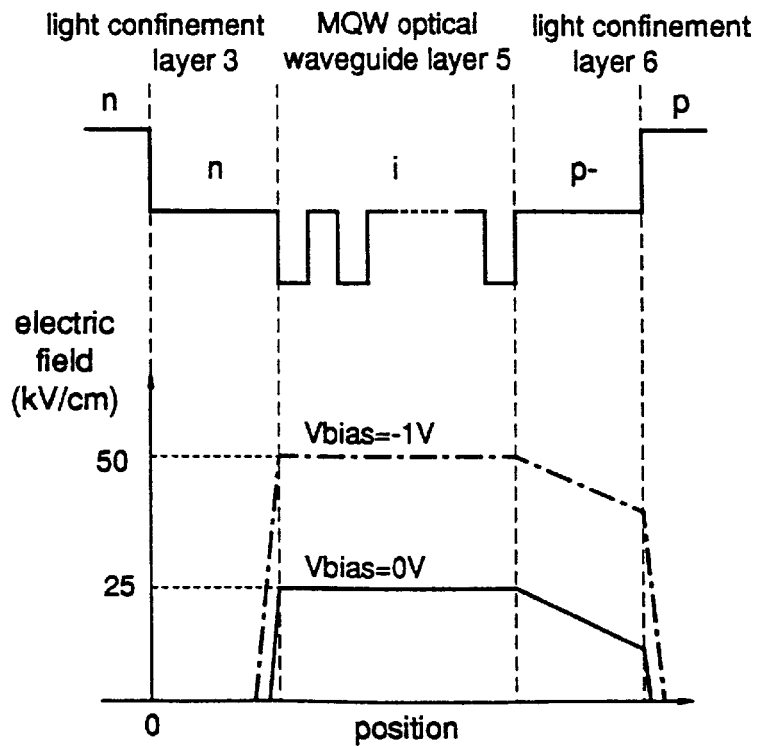

Fig.4 (a)
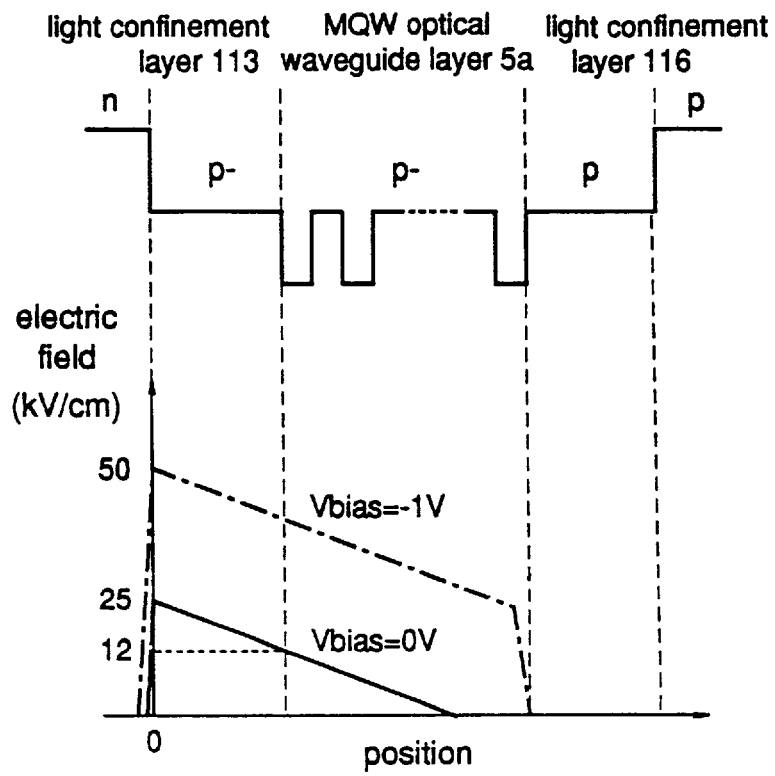
Fig.4 (b) Prior Art
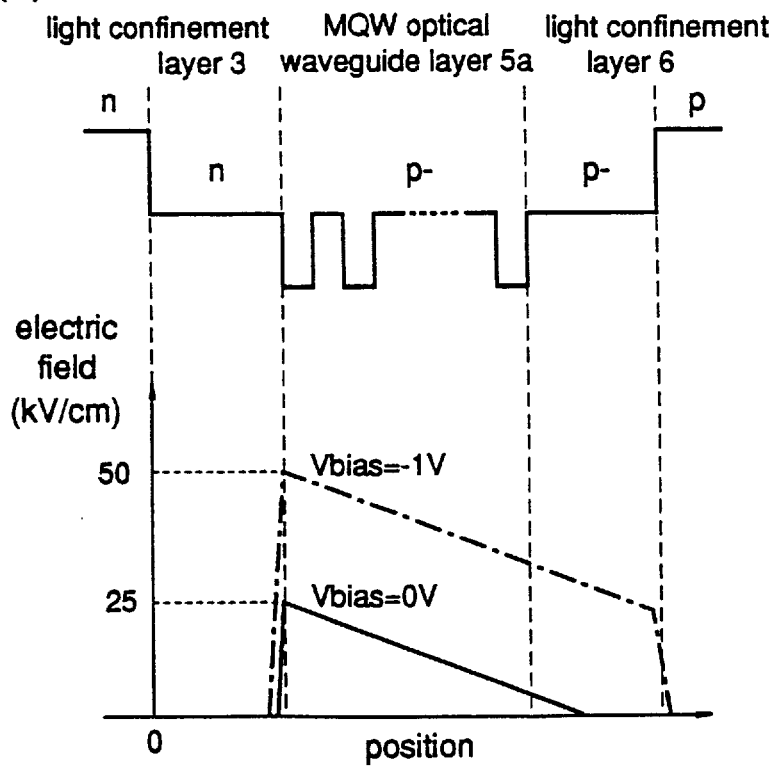

Fig.8 (a)  Prior Art
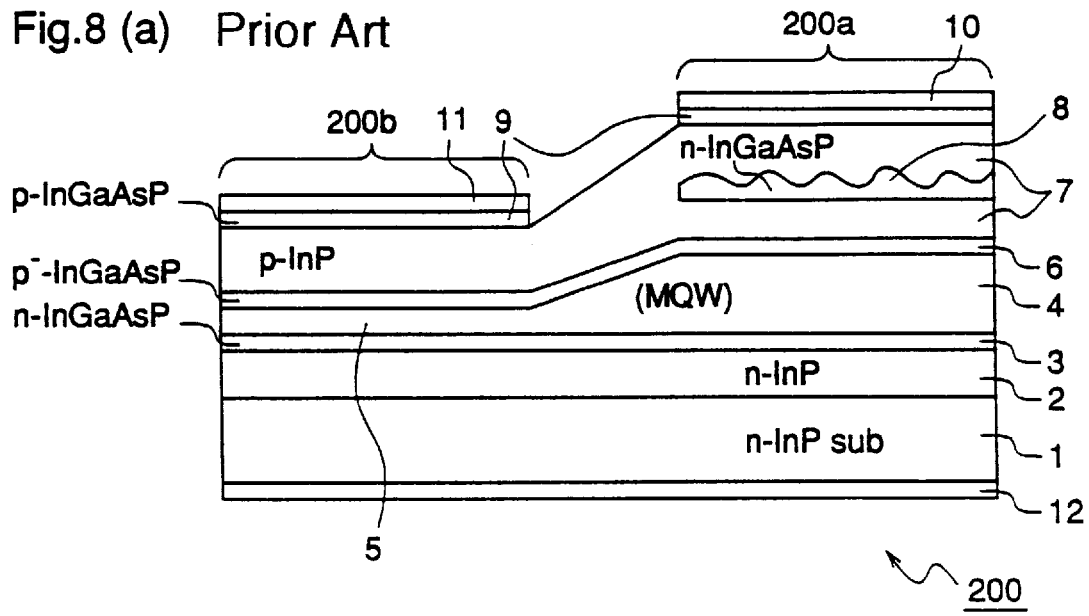
Fig.8 (b)  Prior Art
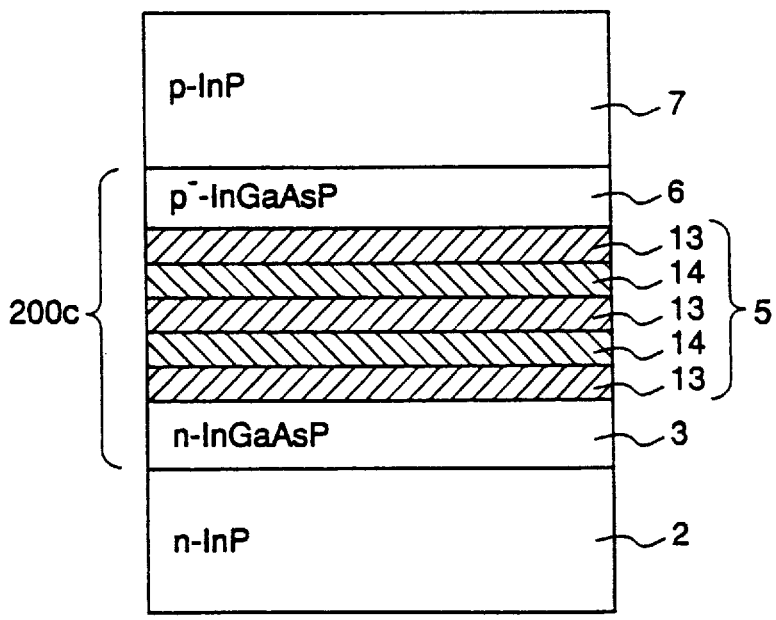

electric field = 0 electric field ≠ 0

Fig.11 (a) Prior Art
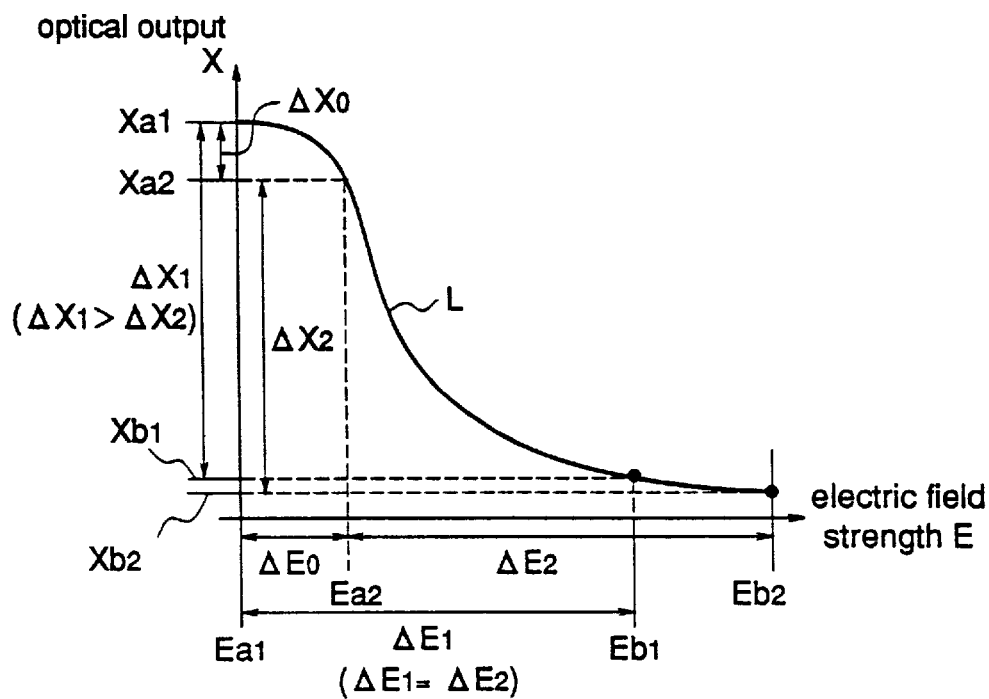
Fig.11 (b) Prior Art
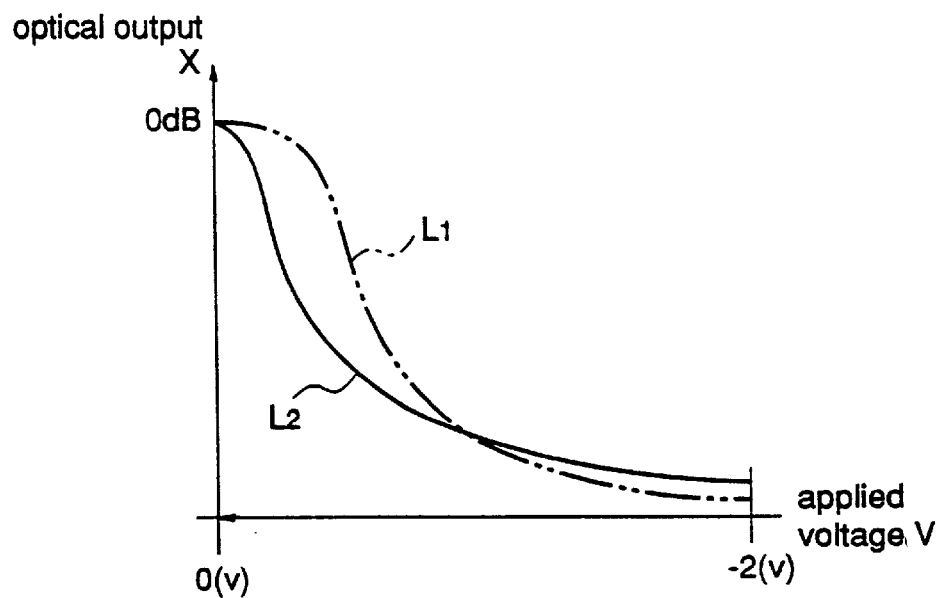

Fig.12 (a) Prior Art
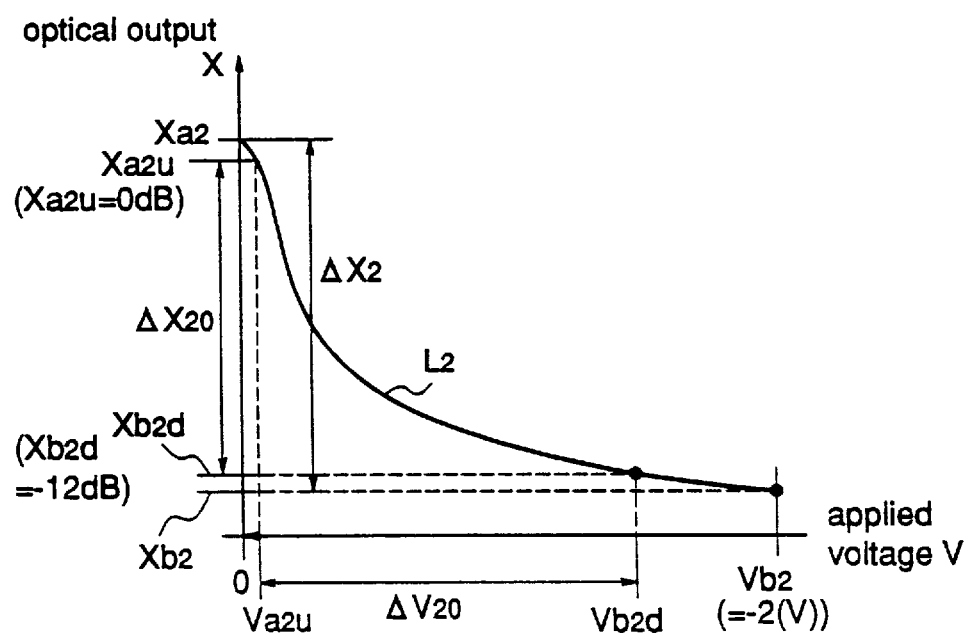
Fig.12 (b) Prior Art
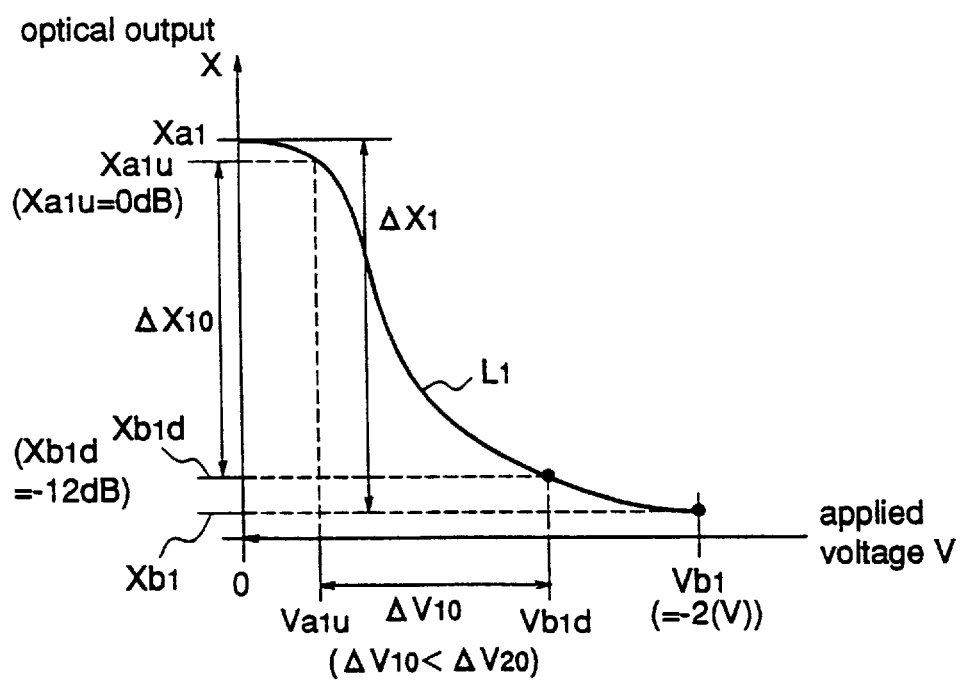

Fig.13 (a) Prior Art
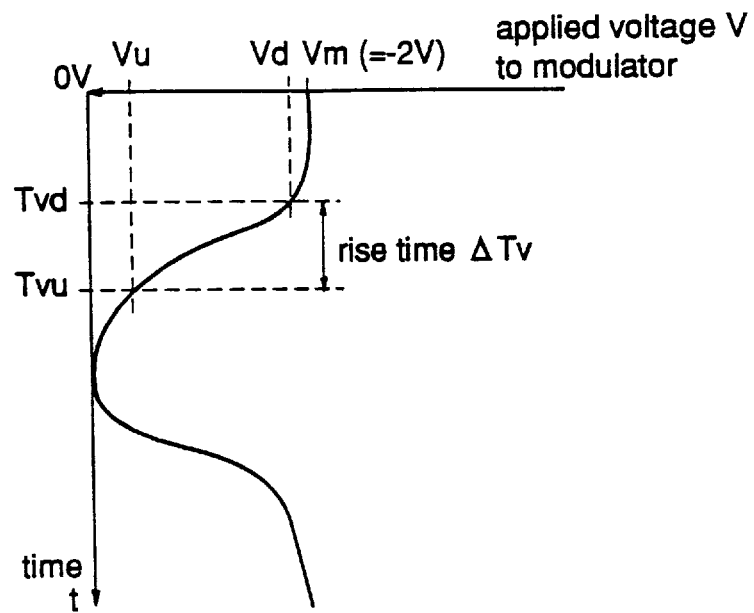
Fig.13 (b) Prior Art
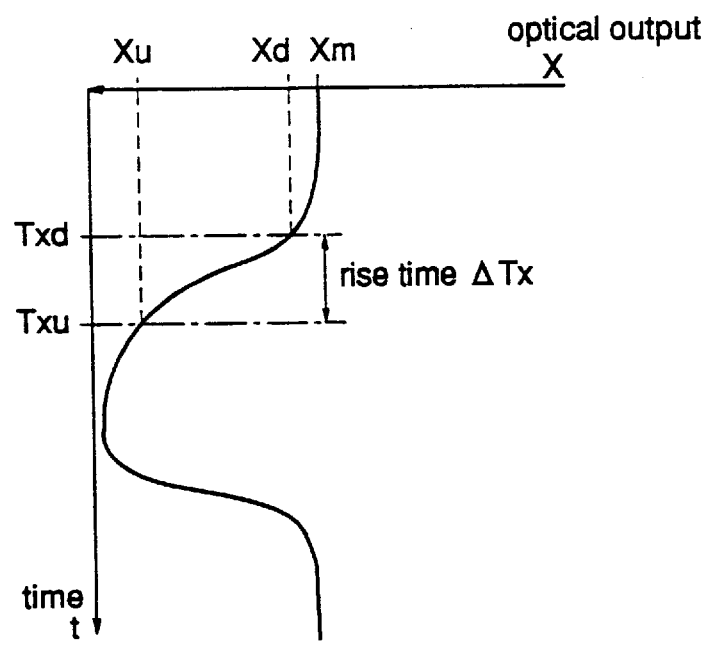

Fig.14 (a) Prior Art
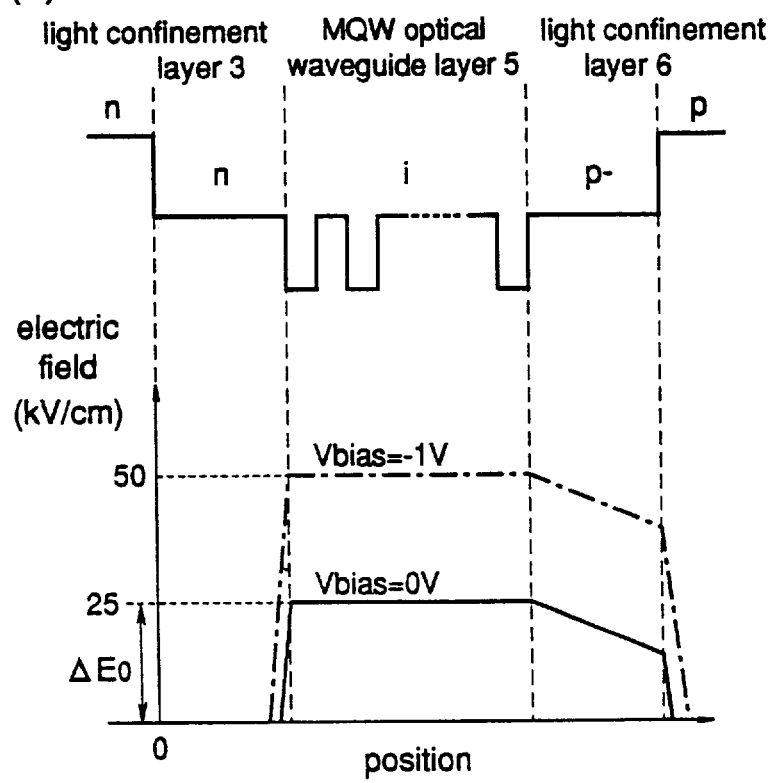
Fig.14 (b) Prior Art
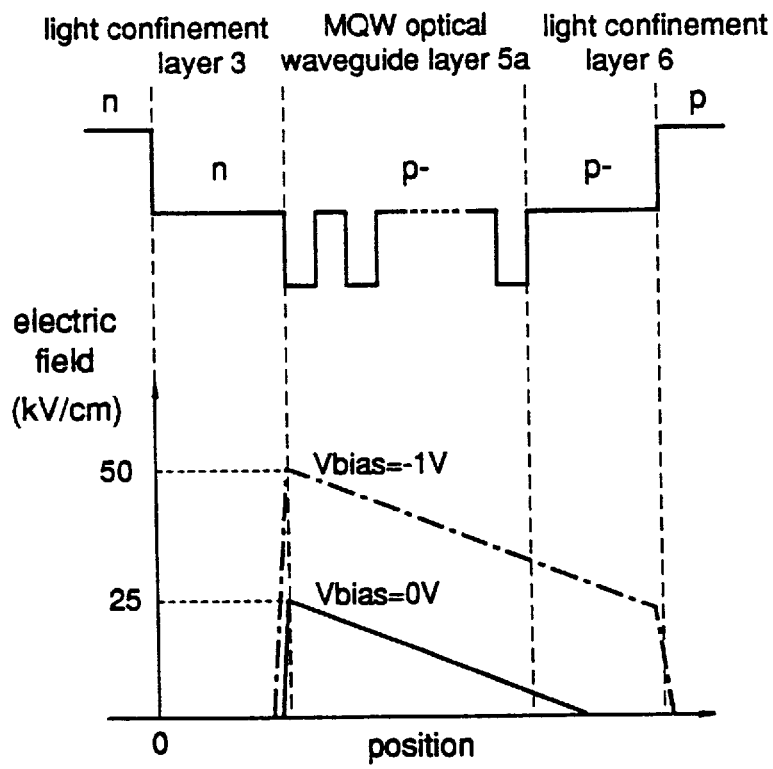

LIGHT ABSORPTION MODULATOR AND INTEGRATED SEMICONDUCTOR LASER AND MODULATOR

FIELD OF THE INVENTION

The present invention relates to a light absorption modulator and an integrated semiconductor laser and modulator and, more specifically, to improved extinction characteristics during the light modulating operation.

BACKGROUND OF THE INVENTION

FIG. 7 is a perspective view illustrating a prior art integrated semiconductor modulator and laser, and FIG. 8(a) is a cross-sectional view thereof.

In FIG. 7, reference numeral 200 designates an integrated semiconductor laser and modulator wherein a laser 200a producing laser light and a light absorption modulator 200b modulating the laser light are monolithically integrated on an n type InP substrate 1. On the n type InP substrate 1, a stripe-shaped ridge structure 210 is disposed over the laser 200a and the modulator 200b.

The modulator 200b comprises an n type InP cladding layer 2, an n type InGaAsP light confinement layer 3, a multiple quantum well optical waveguide layer 5 (hereinafter referred to as an MQW optical waveguide layer), and a $p^{31}$ type light confinement layer 6, which layers are successively disposed on the n type InP substrate. On both sides of the MQW optical waveguide layer 5 and the light confinement layers 3 and 6, Fe-doped semi-insulating InP current blocking layers 21 are disposed. A p type InP cladding layer 7 and a p type InGaAsP contact layer 9 are disposed, in this order, on the p⁻ type light confinement layer 6 and on the current blocking layers 21. In this modulator 200b, the ridge structure 210 comprises the layers 3, 5, 6, 7, 9, and 21.

The n type InP cladding layer 2 is 1 μm thick and has a carrier concentration of $1\times10^{18}$ cm$^{-3}$. The n type InGaAsP light confinement layer 3 is 10 nm thick and has a carrier concentration N of $1\times10^{18}$ cm$^{-3}$. The $p^{31}$ type light confinement layer 6 is 10 nm thick and has a carrier concentration of $1\times10^{17}$ cm$^{-3}$. The p type InP cladding layer 7 is 1.5 μm thick and has a carrier concentration of $1\times10^{18}$ cm$^{-3}$. The p type InGaAsP contact layer 9 is 1 μm thick and has a carrier concentration of $1\times10^{19}$ cm$^{-3}$. The semi-insulating InP current blocking layer 21 is 2 μm thick and has a dopant (Fe) concentration of $4\times10^{16}$ cm$^{-3}$.

As shown in FIG. 8(b), the MQW optical waveguide layer 5 comprises, alternatingly laminated, 7 nm thick InGaAsP well layers 13 and 5 nm thick InGaAsP barrier layers 14. The carrier concentration in the well and barrier layers, which is determined by the p type dopant concentration, is as low as $1\times10^{16}$ cm$^{-3}$, so that the MQW optical waveguide layer 5 has a conductivity type that is generally called i (intrinsic) type. Although the MQW optical waveguide layer 5 shown in FIG. 8(b) comprises only three well layers 13 and two barrier layers 14, an actual MQW optical waveguide layer comprises eight well layers and seven barrier layers.

In the laser 200a, the stripe-shaped ridge structure 210 comprises the n type InGaAsP light confinement layer 3, a multiple quantum well active layer 4 (hereinafter referred to as an MQW active layer), the p⁻ type light confinement layer 6, and the p type InP cladding layer 7, which layers are successively disposed on the n type InP cladding layer 2. The MQW active layer 4 is continuous with the MQW optical waveguide layer 5 of the modulator 200b, and comprises, alternatingly laminated, eight well layers 13 and seven barrier layers 14. However, in the i type MQW active layer 4, each well layer 13 is 9 nm thick and each barrier layer 14 is 6 nm thick, that is, the well layers 13 and the barrier layers 14 are thicker in the MQW active layer 4 than in the MQW optical waveguide layer 5. The p type InP cladding layer 7 in the laser 200a has an InGaAsP diffraction grating layer 8 in the center, so that it is thicker than the cladding layer 7 in the modulator 200b. The InGaAsP diffraction grating layer 8 is 40 nm thick and has a carrier concentration of $1\times10^{18}$ cm$^{-3}$.

In the laser 200a, on the n type InP cladding layer 2 at both sides of the ridge structure 210, Fe-doped semi-insulating InP current blocking layers 21, n type InP current blocking layers 22, and p type InP layers 23 are successively disposed. The semi-insulating InP current blocking layers 21 are 2 μm thick and have a dopant (Fe) concentration of $4\times10^{16}$ cm$^{-3}$, the n type InP current blocking layers 22 are 0.5 μm thick and have a carrier concentration of $2\times10^{18}$ cm$^{-3}$, and the p type InP layers 23 are 1 μm thick and have a carrier concentration of $1\times10^{18}$ cm$^{-3}$. The n type InGaAsP contact layer 9 is disposed on the p type InP cladding layer 7 and on the p type InP layers 23.

At both sides of the ridge structure 210, grooves 220 are formed from the surface of the contact layer 9 to reach the n type InP cladding layer 2. The surface of the contact layer 9 and the inside surfaces of the grooves 220 are covered with an insulating film 24, and the insulating film 24 has an opening 24a, opposite the ridge structure 210, to expose the contact layer 9.

In the laser 200a, a p side electrode 10 is disposed on the insulating film 24 across the ridge structure 210, contacting the contact layer 9 through the opening 24a of the insulating film 24. This p side electrode 10 has a laminated structure of Ti/Pt/Au in which a Ti layer, a Pt layer and an Au layer are laminated in this order.

On the other hand, in the modulator 200b, the upper surface and the side surfaces of the ridge structure 210 are covered with the insulating film 24, and the insulating film 24 has an opening 24b, opposite the ridge structure 210, to expose the contact layer 9. A p side electrode 11 is disposed on the ridge structure 210, contacting the contact layer 9 through the opening 24b of the insulating film 24. This p side electrode 11 is electrically separated from the p side electrode 10 of the laser 200a by the insulating film 24 in the isolation region 15. Further, in the modulator 200b, a projection 230 is formed in the vicinity of the ridge structure 210, and a bonding pad 11a is disposed on the projection 230. The bonding pad 11a and the p side electrode 11 are continuous and comprise a metal layer having a Ti/Pt/Au structure.

Further, an n side electrode 12 common to the laser 200a and the modulator 200b is disposed on the rear surface of the n type InP substrate 1. This n side electrode 12 has an Au/Ge/Ni/Au structure in which an Au layer, a Ge layer, an Ni layer, and an Au layer are disposed in this order from the rear surface of the substrate 1.

In the integrated semiconductor laser and modulator 200, Zn, Be, or Mg is employed as a dopant impurity to produce the p type semiconductor layers, and S, Si, or Se is employed as a dopant impurity to produce the n type semiconductor layers.

In the integrated semiconductor laser and modulator 200 so constructed, when a drive voltage is applied to the p side electrode 10 of the laser 200a to inject a drive current into the MQW active layer 4, laser oscillation occurs in the MQW active layer 4. Laser light produced by the laser oscillation travels toward the MQW optical waveguide layer 5 in the modulator 200b.

When no voltage is applied to the p side electrode 11 of the modulator 200b, the laser light is emitted without being absorbed by the MQW optical waveguide layer 5. On the other hand, when a reverse bias voltage is applied to the p side electrode 11, the laser light is absorbed by the MQW optical waveguide layer 5 in the modulator 200b, so that it is not emitted from the modulator 200b.

A description is given of the operating principle of a typical light absorption modulator. A light absorption modulator utilizes, for the modulating operation, the quantum confined Stark effect. The quantum confined Stark effect is a phenomenon in which the energy level of an exciton, i.e., the energy levels of an electron and hole pair which are excited to the energy levels a1 and a2 in a quantum well, changes when a voltage is applied to the quantum well layer. To be specific, the band gap Eg' in the quantum well layer (the difference between the energy levels b1 and b2) in the state where an electric field is generated in the quantum well (FIG. 9(b)) is smaller than the band gap Eg (the difference between the energy levels a1 and a2) in the state where no electric field is generated (FIG. 9(a)). In FIGS. 9(a) and 9(b), A1, A2, B1, and B2 are lines showing wave functions. More specifically, lines A1 and A2 show the probability of the presence of an electron and a hole, respectively, in the state where no electric field is generated in the quantum well layer, and lines B1 and B2 show the probability of the presence of an electron and a hole, respectively, in the state where an electric field is generated in the quantum well layer.

When the band gap in the quantum well layer changes from Eg to Eg', the exciton absorption characteristic of the quantum well layer, i.e., the characteristic in which an electron and hole pair is produced due to absorption of light of a prescribed energy in the quantum well layer, changes from that shown by characteristic line G0 (electric field $E_v=0$) to that shown by characteristic line G1 (electric field E=0) shown in FIG. 10, whereby the absorption wavelength due to the exciton changes. For example, the absorption coefficient of laser light having a modulation wavelength $x_L$ changes from a0 to a1, and the amount of the laser light transmitted through the quantum well layer changes by a value corresponding to the difference $\Delta a$ (=a1−a0) between the absorption coefficients.

Accordingly, in the state where the electric field within the MQW optical waveguide layer 5 is 0, the laser light having the modulation wavelength $x_L$ is transmitted through the modulator 200b. When an electric field is generated in the quantum well, the laser light having the modulation wavelength $x_L$ is absorbed by the modulator 200b, so that it is not output from the modulator 200b.

In the integrated semiconductor laser and modulator 200 mentioned above, both the MQW active layer 4 in the laser 200a and the MQW optical waveguide layer 5 in the modulator 200b are i type. However, in the actual fabrication process, since p type impurities in the p⁻ type light confinement layer 6 diffuse into the MQW optical waveguide layer 5, the conductivity type of the MQW optical waveguide layer 5 tends to be p type and, therefore, it is easier to fabricate a p⁻ type MQW optical waveguide layer than to fabricate an i type MQW optical waveguide layer. In this case, the carrier concentration in the InGaAsP barrier layers 13 and the InGaAsP well layers 14 constituting the p³¹ type MQW optical waveguide layer 5a (refer to FIG. 14(b)), which carrier concentration is determined by the p type dopant concentration in these layers, is about $3\times10^{17}$ cm$^{-3}$.

However, in the modulator 200b in the integrated semiconductor laser and modulator 200, even when a voltage applied to the modulator 200b is 0, an electric field is generated in the MQW optical waveguide layer 5. Therefore, in the process of decreasing the reverse bias voltage V applied to the modulator 200b from −2 V to 0 V, the optical output X from the modulator 200b does not increase suddenly but increases gradually, so that the rise time $\Delta T_X$ of the optical output X (refer to FIG. 13(b)) becomes longer.

More specifically, in FIG. 11(a), characteristic line L shows the relationship between the optical output X from the modulator 200b and the electric field strength E in the MQW optical waveguide layer 5. FIG. 14(a) shows the electric field strength distribution in the MQW optical waveguide layer 5 and the light confinement layers 3 and 6. As shown in these figures, in the modulator 200b, even when the applied voltage is 0 V, a relatively large initial electric field $\Delta E0$ (25 kV/cm) is generated in the MQW optical waveguide layer 5 due to a depletion layer that is formed at the interface between the n type InGaAsP light confinement layer 3 and the i type MQW optical waveguide layer 5. Therefore, as shown in FIG. 11(a), the optical output X at this time is attenuated from the maximum level $X_{a1}$, that is attained when no electric field is generated in the MQW optical waveguide layer 5, to the level $X_{a2}$ corresponding to the electric field strength $E_{a2}$. Accordingly, in the modulator 200b, as shown in FIG. 12(a), when the applied voltage V changes from 0 V to the level $V_{b2}$ (=−2 V), the optical output X is attenuated from the output level $X_{a2}$, by an amount of $\Delta X2$ corresponding to the electric field variation $\Delta E2$, to the level $X_{b2}$ corresponding to the electric field strength $E_{b2}$. In contrast with this, when the applied voltage V changes from the level $V_{b2}$ (=−2 V) to 0 V, the optical output X increases from the level $X_{b2}$, by the amount of the attenuation, $\Delta X2$, to the level $X_{a2}$.

On the other hand, assuming that the initial electric field $\Delta X0$ is not generated in the MQW optical waveguide layer 5, since the optical output X is not attenuated when the applied voltage is 0 V, when the voltage V applied to the modulator 200b changes from 0 V to the level $V_{b1}$ (=−2 V), the optical output X is attenuated from the maximum output level $X_{a1}$, by an amount of $\Delta X1$ corresponding to the electric field variation $\Delta E1$, to the level $X_{b1}$ corresponding to the electric field strength $E_{b1}$. In contrast with this, when the applied voltage V changes from the level $V_{b1}$ (=−2 V) to 0 V, the optical output X increases from the level $X_{b1}$, by the amount of the attenuation, $\Delta X1$, to the maximum level $X_{a1}$. In figure 11(b), a portion of characteristic line L shown in FIG. 11(a) within the range of the electric field strength from $E_{a1}$ to $E_{b1}$ (double dotted L1) and a portion of characteristic line L within the range of the electric field strength from $E_{a2}$ to $E_{b2}$ (solid line L2) are shown so that the maximum optical outputs in the respective ranges are adjusted to the reference value, 0 dB. The characteristic line L2 shown in FIG. 12(a) is identical to the solid line L2 shown in FIG. 11(b), and the characteristic line L1 shown in FIG. 12(b) is identical to the double dotted line L1 shown in FIG. 11(b).

FIG. 13(a) shows the waveform of the voltage (reverse bias) V applied to the modulator 200b. The minimum value $V_m$ of the applied voltage V is −2 V. The rise time $\Delta T_v$ of the applied voltage V is the time ($T_{vu}-T_{vd}$) required to increase the level of the applied voltage V from $V_d$ (−1.8 V) that is equal to 90% of the minimum value $V_m$ to $V_u$ (−0.2 V) that is equal to 10% of the minimum value $V_m$. FIG. 13(b) shows the waveform of the optical output X from the modulator 200b, wherein the minimum level $X_m$ of the optical output X is an optical output level obtained when the reverse bias voltage V (=−2 V) is applied to the modulator 200b. The rise time $\Delta T_x$ of the optical output X is the time $(T_{xu}-T_{xd})$ required to increase the level of the optical output X from $X_d$ that is equal to 90% of the minimum value $X_m$ to $X_u$ that is equal to 10% of the minimum value $X_m$.

The rise time of the optical output level X when the voltage (reverse bias) V having the waveform shown in FIG. 13(a) is applied to the modulator 200b will be examined.

In the modulator wherein the initial electric field $\Delta E0$ is generated in the MQW optical waveguide layer even though the applied voltage V is 0 V as in the modulator 200b of the integrated semiconductor laser and modulator 200, the rise time $\Delta T_x$ of the optical output X is the time during which the optical output X changes from the attenuation level $X_{b2d}$ that is equal to 90% of the minimum level $X_{b2}$ to the attenuation level $X_{a2u}$ that is equal to 10% of the minimum level $X_{b2}$ and, within the rise time, the applied voltage V increases from the voltage level $V_{b2d}$ corresponding to the attenuation level $X_{b2d}$, by the variation $\Delta V20$ in the voltage, to the voltage level $V_{a2u}$ corresponding to the attenuation level $X_{a2u}$.

On the other hand, when the initial electric field $\Delta E0$ is not generated in the MQW optical waveguide layer 5, the rise time $\Delta T_x$ of the optical output X is the time during which the optical output X changes from the attenuation level $X_{b1d}$ that is equal to 90% of the minimum attenuation level $X_{b1}$ to the attenuation level $X_{a1u}$ that is equal to 10% of the minimum attenuation level $X_{b1}$ and, within the rise time, the applied voltage V increases from the voltage level $V_{b1d}$ corresponding to the attenuation level $X_{b1d}$, by the variation $\Delta V10$ in the voltage, to the voltage level $V_{a1u}$ corresponding to the attenuation level $X_{a1u}$.

As described above, the applied voltage V varies when the optical output level increases from the level equal to 90% of the minimum attenuation level to the level equal to 10% of the minimum attenuation level. When the variation in the applied voltage V in the case where the initial electric field $\Delta E0$ is generated in the MQW optical waveguide layer 5 is compared with that in the case where the initial electric field $\Delta E0$ is not generated in the layer 5, it is found that the variation $\Delta V20$ in the case where the initial electric field $\Delta E0$ is generated is larger than the variation $\Delta V10$ in the case where the initial electric field $\Delta E0$ is not generated. In other words, in the modulator 200b, because of the generation of the initial electric field $\Delta E0$ in the MQW optical waveguide layer 5, the rise time $\Delta T_x$ of the optical output becomes longer.

FIG. 14(b) shows the electric field distribution within the $p^-$ type MQW optical waveguide layer 5a and the light confinement layers 3 and 6 disposed on upper and lower sides of the waveguide layer 5a. Also in the modulator including the $p^-$ type MQW optical waveguide layer 5a, as in the modulator including the i type MQW optical waveguide layer 5, the initial electric field $\Delta E0$ is generated in the MQW optical waveguide layer 5a even through the voltage applied to the modulator is 0 V, and this electric field increases the rise time of the optical output X from the modulator.

SUMMARY OF THE INVENTION

It is an object of the present invention to provide a field absorption type modulator that can reduce the rise time of the optical output.

It is another object of the present invention to provide an integrated semiconductor laser and modulator that can reduce the rise time of the optical output.

Other objects and advantages of the invention will become apparent from the detailed description that follows. The detailed description and specific embodiments described are provided only for illustration since various additions and modifications within the scope of the invention will be apparent to those of skill in the art from the detailed description.

According to a first aspect of the present invention, a field absorption type modulator comprises a semiconductor substrate of a first conductivity type; a first cladding layer of the first conductivity type disposed on the substrate; an optical waveguide disposed on the first cladding layer and comprising a multiple quantum well optical waveguide layer through which light travels and first and second light confinement layers which are respectively disposed on upper and lower surfaces of the optical waveguide layer to confine the light in the optical waveguide layer; and a second cladding layer of a second conductivity type, opposite the first conductivity type, disposed on the optical waveguide; wherein one of the first and second cladding layers has n type conductivity, one of the first and second light confinement layers that contacts the cladding layer of the n type conductivity has p type conductivity, and the light traveling through the optical waveguide layer is modulated by applying an electric field to the optical waveguide layer. Therefore, the electric field strength in the multiple quantum well optical waveguide layer when no reverse bias is applied to the modulator can be reduced, whereby the rise time of optical output from the modulator can be reduced.

According to a second aspect of the present invention, in the field absorption type modulator, the p type light confinement layer contacting the n type cladding layer comprises InGaAsP and has a carrier concentration larger than $1\times10^{17}$ cm$^{-3}$ and smaller than $1\times10^{18}$ cm$^{-3}$. Therefore, a high electric field strength can be maintained in the multiple quantum well optical waveguide layer when a reverse bias is applied to the modulator while suppressing the electric field strength in the optical waveguide layer when no reverse bias is applied to the modulator, whereby a large extinction ratio is realized.

According to a third aspect of the present invention, an integrated semiconductor laser and modulator comprises a semiconductor substrate of a first conductivity type, a laser producing laser light, and a field absorption type modulator modulating the laser light, which laser and modulator are monolithically integrated on the semiconductor substrate. In this structure, the field absorption type modulator comprises a first cladding layer of the first conductivity type disposed on the substrate; an optical waveguide disposed on the first cladding layer and comprising a multiple quantum well optical waveguide layer through which light travels and first and second light confinement layers which are respectively disposed on upper and lower surfaces of the optical waveguide layer to confine the light in the optical waveguide layer; and a second cladding layer of a second conductivity type, opposite the first conductivity type, disposed on the optical waveguide; wherein one of the first and second cladding layers has n type conductivity, one of the first and second light confinement layers which contacts the cladding layer of the n type conductivity has p type conductivity, and the light traveling through the optical waveguide layer is modulated by applying an electric field to the optical waveguide layer. Therefore, the electric field strength in the multiple quantum well optical waveguide layer when no reverse bias is applied to the modulator can be reduced, whereby the rise time of optical output from the modulator can be reduced.

According to a fourth aspect of the present invention, in the integrated semiconductor laser and modulator, the p type light confinement layer contacting the n type cladding layer comprises InGaAsP and has a carrier concentration larger than $1 \times 10^{17}$ cm$^{-3}$ and smaller than $1 \times 10^{18}$ cm$^{-3}$. Therefore, a high electric field strength can be maintained in the multiple quantum well optical waveguide layer when a reverse bias is applied to the modulator while suppressing the electric field strength in the optical waveguide layer when no reverse bias is applied to the modulator, whereby a large extinction ratio is realized.

BRIEF DESCRIPTION OF THE DRAWINGS

FIGS. 3(a) and 3(b) are diagrams illustrating electric field strengths in optical waveguide structures having i type MQW optical waveguide layers according to the first embodiment of the invention and the prior art, respectively.

FIGS. 4(a) and 4(b) are diagrams illustrating electric field strengths in optical waveguide structures having p$^-$ type MQW optical waveguide layers according to the first embodiment of the invention and the prior art, respectively.

FIG. 8(a) is a cross-sectional view of the prior art integrated semiconductor laser and modulator along a stripe-shaped ridge structure, and FIG. 8(b) is a cross-sectional view of an optical waveguide structure in the modulator.

FIGS. 11(a) and 11(b) are diagrams illustrating the field strength E vs. optical output X characteristics and the applied voltage V vs. optical output X characteristics, respectively, in the MQW optical waveguide layer in the prior art modulator.

FIGS. 12(a) and 12(b) are diagrams illustrating the applied voltage V vs. optical output X characteristics in the prior art modulator, in the case where an electric field is generated at zero bias (12(a)) and in the case where no electric field is generated at zero bias (12(b)).

FIGS. 13(a) and 13(b) are diagrams illustrating a waveform of voltage applied to the prior art modulator and a waveform of optical output from the modulator, respectively. FIGS. 14(a) and 14(b) are diagrams illustrating electric field strength in optical waveguide structures according to the prior art.

DETAILED DESCRIPTION OF THE PREFERRED EMBODIMENTS

[Embodiment 1]

Figure 1:
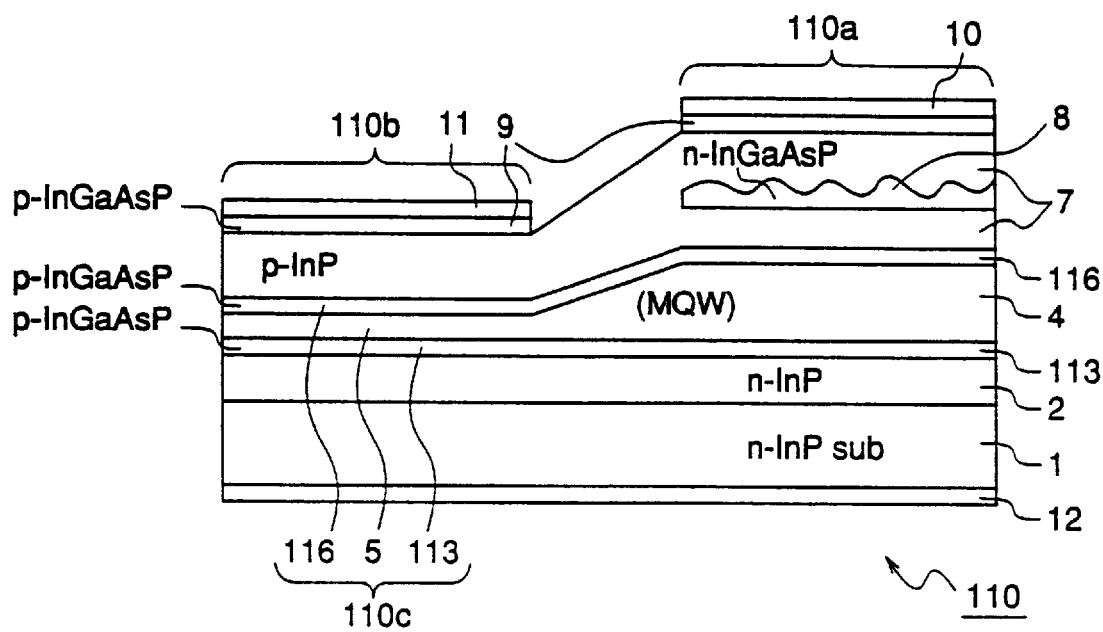
FIG. 1(a) is a cross-sectional view illustrating an integrate semiconductor laser and modulator along a stripe-shaped ridge structure.
FIG. 1(b) is a cross-sectional view illustrating an optical waveguide structure in the modulator, according to the first embodiment of the invention.
Figure 1:
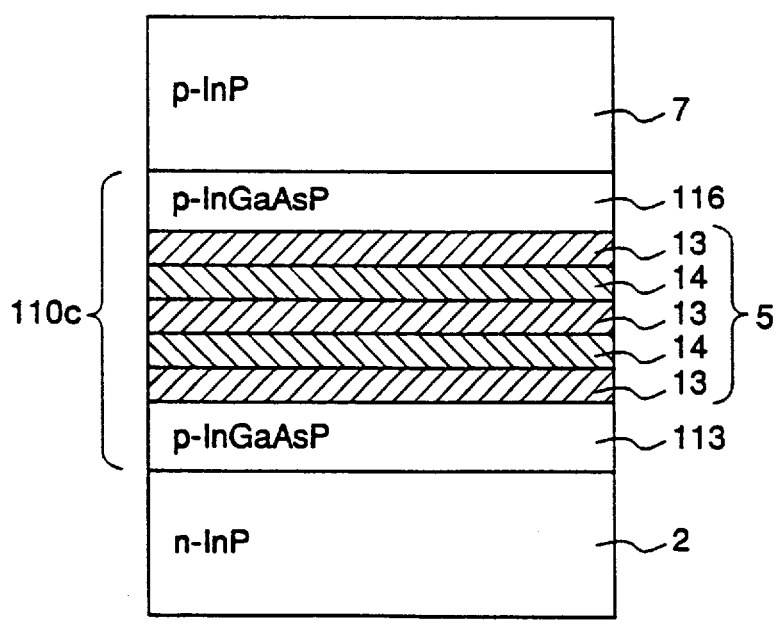

FIG. 1(a) is a cross-sectional view illustrating an integrated semiconductor laser and modulator along a stripe-shaped ridge structure according to a first embodiment of the present invention. FIG. 1(b) shows an MQW optical waveguide layer, light confinement layers, and cladding layers, which layers constitute the ridge structure in the modulator.

In figure 1(a), reference numeral 110 designates an integrated semiconductor laser and modulator wherein a laser 110a producing laser light and a modulator 110b modulating the laser light are monolithically integrated on an n type InP substrate 1.

In this first embodiment of the invention, an optical waveguide structure 110c in the modulator 110b comprises a p$^-$ type InGaAsP light confinement layer 113 disposed on the n type InP cladding layer 2, an i type MQW optical waveguide layer 5 disposed on the light confinement layer 113, and a p type InGaAsP light confinement layer 116 disposed on the optical waveguide layer 5. Other constituents are identical to those of the prior art integrated semiconductor laser and modulator 200.

Figure 2:
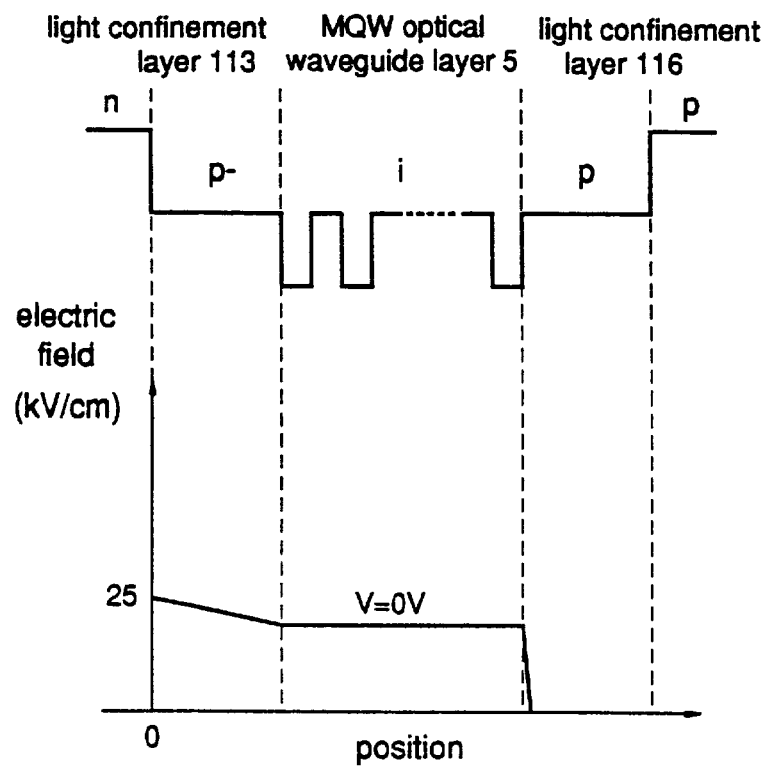
FIGS. 2(a) and 2(b) are diagrams for explaining bases for a lower limit value and an upper limit value of concentration of a p$^-$ type light confinement layer in the modulator, respectively, according to the first embodiment of the invention.
Figure 2:
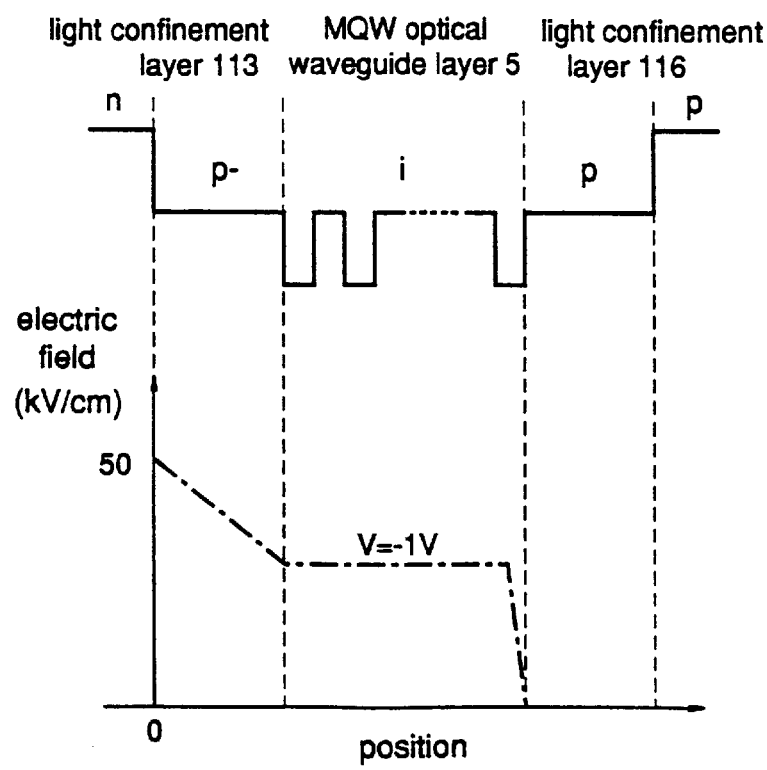

The p$^-$ type InGaAsP light confinement layer 113 has a carrier concentration of $3 \times 10^{17}$ cm$^{-3}$. The carrier concentration of the light confinement layer 113 is desired to be larger than $1 \times 10^{17}$ cm$^{-3}$ and smaller $1 \times 10^{18}$ cm$^{-3}$. Preferably, it is within a range of $3 \sim 5 \times 10^{17\ cm-3}$. The reason is as follows. When the carrier concentration is too low, the electric field strength in the MQW optical waveguide layer 5 in the state where no reverse bias (0 V) is applied to the modulator 110b becomes high as shown in FIG. 2(a). On the other hand, when the carrier concentration is too high, the electric field strength in the MQW optical waveguide layer 5 in the state where a reverse bias (−1 V) is applied to the modulator 110b becomes low. In other words, when the carrier concentration of the light confinement layer 113 is outside the range from $1 \times 10^{17}$ cm$^{-3}$ to $1 \times 10^{18}$ cm$^{-3}$, the extinction ratio decreases significantly.

The purpose of the carrier concentration of the p type InGaAsP light confinement layer 116 being as high as the carrier concentration of the p type InP cladding layer $1 \times 10^{18}$ cm$^{-3}$) is to prevent an electric field from being generated in the light confinement layer 116 in the state where a reverse bias is applied to the modulator 110b. When no electric field is generated in the light confinement layer 116, the electric field strength in the MQW optical waveguide layer 5 in the reverse bias applied state increases, resulting in an increased extinction ratio.

A description is given of the function and effect.

FIG. 3(a) shows the electric field distribution in the MQW optical waveguide layer 5 in the modulator 110b according to the first embodiment, and FIG. 3(b) shows the electric field distribution in the prior art modulator 200b.

In this first embodiment, as shown in FIG. 3(a), since the light confinement layer 113 on the n type cladding layer 2 comprises p$^-$ type InGaAsP, the electric field strength in the MQW optical waveguide layer 5 in the state where no reverse bias is applied to the modulator 110b is smaller than that in the prior art modulator 200b in which the light confinement layer on the n type cladding layer 2 comprises n type InGaAsP (refer to FIG. 8(a)). To be specific, in the modulator 110 according to the first embodiment, as shown in FIG. 3(a), the strength of the electric field that is generated in the MQW optical waveguide layer 5 at the interface with the n type cladding layer 2 when the applied voltage V is 0 V is reduced to 12 kV/cm, that is, about half of the electric field strength, 25 kV/cm, in the prior art modulator 200b.

Figure 5:
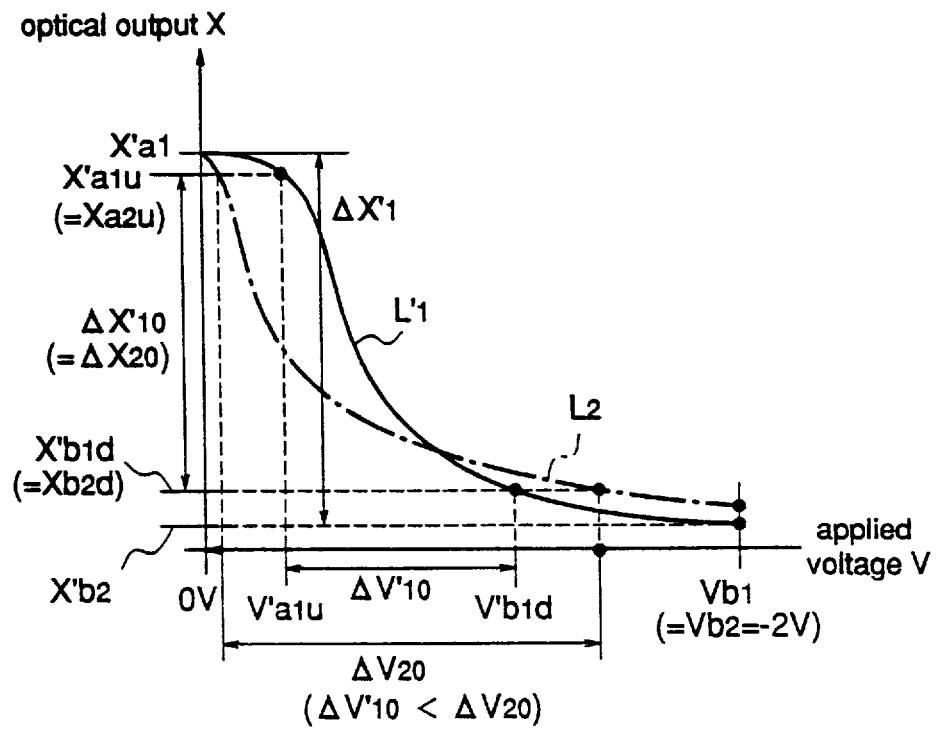
FIG. 5(a) is a diagram illustrating extinction characteristics of the modulator.
FIG. 5(b) is a diagram illustrating a waveform of optical output from the modulator, according to the first embodiment of the invention.
Figure 5:
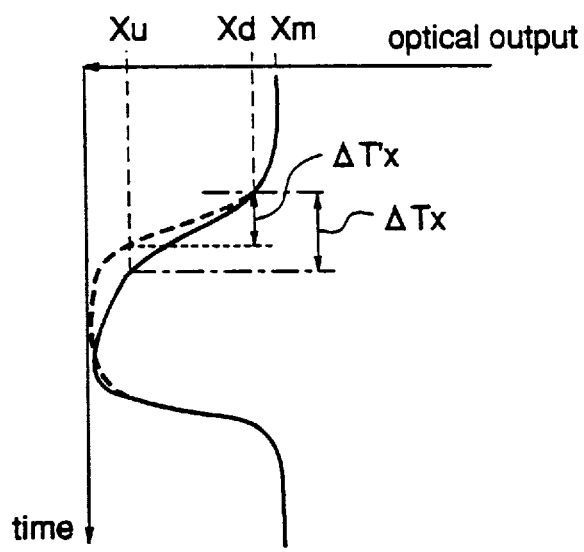

Accordingly, the extinction characteristic of the modulator 110b shown by line L1' in FIG. 5(a) closely resembles the characteristic shown by line L1 in FIG. 12(b).

In FIG. 5(a), line L2 shows the extinction characteristic of the prior art modulator 200b. Further, the rate of increase in the amount of attenuation when the applied voltage is 0 V decreases from 8 dB/V (characteristic line L2 according to the prior art) to 2 dB/V (characteristic line L1' according to the first embodiment).

In the extinction characteristic according to the first embodiment shown by line L1', when the amount of attenuation of the optical output X is within a range from the level $X'_{blu}$ that is about 90% of the maximum attenuation level $X'_{b2}$ to the level $X'_{alu}$ that is about 10% of the maximum attenuation level $X_{b2}$, the variation $\Delta V'10$ in the absolute value of the applied voltage V, i.e., the variation $\Delta X'10$ in the attenuation of the optical output X with the change from the level $V'_{bld}$ to the level $V_{alu}$, is large. In other words, the optical output X increases suddenly when the absolute value of the applied voltage starts to decrease from its maximum value, but it hardly changes when the absolute value is in the proximity of its minimum value that is not related to the rise time. Consequently, in this first embodiment of the invention, as shown in FIG. 5(b), the rise time $\Delta$, is reduced to 80 ps from the rise time $\Delta T_x$ (=150 ps) according to the prior art, whereby the information transfer characteristic is improved.

As described above, according to the first embodiment of the present invention, the laser 110a producing laser light and the field absorption type modulator 110b modulating the laser light are monolithically integrated on the n type InP substrate 1. In this structure, the optical waveguide structure 110c in the modulator 110b comprises the MQW optical waveguide layer 5 for guiding laser light emitted from the laser 110a and the light confinement layers 116 and 113 respectively disposed on opposed upper and lower sides of the optical waveguide layer 5 to confine the light in the optical waveguide layer 5, and the lower light confinement layer 113 contacting the n type InP cladding layer 2 comprises p⁻ type InGaAsP. Therefore, the electric field strength in the MQW optical waveguide layer 5 when no voltage is applied to the modulator 110b is reduced, whereby the rise time $\Delta T'_x$ of the optical output X from the modulator 110b is reduced.

Further, since the carrier concentration of the p⁻ type light confinement layer 113 contacting the n type cladding layer 2 is larger than $1\times10^{17}$ cm⁻³ and smaller than $1\times10^{18}$ cm⁻³, it is possible to maintain a high electric field strength in the MQW optical waveguide layer 5 when a reverse bias is applied to the modulator 110b while suppressing the electric field strength in the MQW optical waveguide layer 5 when no reverse bias is applied to the modulator 110b, whereby a large extinction ratio is realized.

Further, since the light confinement layer 116 on the MQW optical waveguide layer 5 comprises a p type semiconductor having a carrier concentration as high as $1\times10^{18}$ cm⁻³, the electric field caused by the voltage applied to the modulator 110 is scarcely present in the light confinement layer 116, and it is concentrated into the underlying MQW optical waveguide layer 5, whereby the extinction ratio is increased.

Furthermore, since the conductivity type of the MQW optical waveguide layer 5 is i type, the electric field strength is uniform over the well layers 13 in the MQW optical waveguide layer 5. Therefore, the selectivity of a laser wavelength as a target of modulation is improved, whereby the extinction ratio is increased.

In the integrated semiconductor laser and modulator 110 according to the first embodiment, the conductivity type of the MQW optical waveguide layer 5 in the modulator 110b is i type. However, in the actual device, a p⁻ type MQW optical waveguide layer 5a is preferred to an i type MQW optical waveguide layer 5. The reason is as follows.

In the actual fabrication process, since p type impurities in the p⁻ type light confinement layer 6 diffuse into the MQW optical waveguide layer 5, the conductivity type of the MQW optical waveguide layer 5 tends to be p type. Hence, it is easier to fabricate a p⁻ type MQW optical waveguide layer than to fabricate an i type MQW optical waveguide layer. In this case, the carrier concentration in the InGaAsP barrier layers 13 and the InGaAsP well layers 14 constituting the p⁻ type MQW optical waveguide layer 5a (refer to FIG. 4(a)) is desired to be about $3\times10^{17}$ cm⁻³.

In the modulator employing the p⁻ type MQW optical waveguide layer 5a, as in the modulator employing the i type MQW optical waveguide layer 5, the rise time of the optical output from the modulator is reduced and the extinction ratio is increased compared with the prior art modulator including the n type light confinement layer on the n type cladding layer. In addition, the production process is simplified.

Although the barrier layers 13 included in the MQW optical waveguide layer 5 comprise InGaAsP in this first embodiment, the barrier layers 13 may comprise AlInAs. In this case, the hole confining energy in the well layers 14 in the MQW optical waveguide layer 5 is lowered, whereby holes generated in the MQW optical waveguide layer 5 due to exciton absorption are easily discharged from the MQW optical waveguide layer 5 into the p side electrode 11 of the modulator 110b. As a result, the high frequency characteristics of the modulator 11b are improved.

[Embodiment 2]

Figure 6:
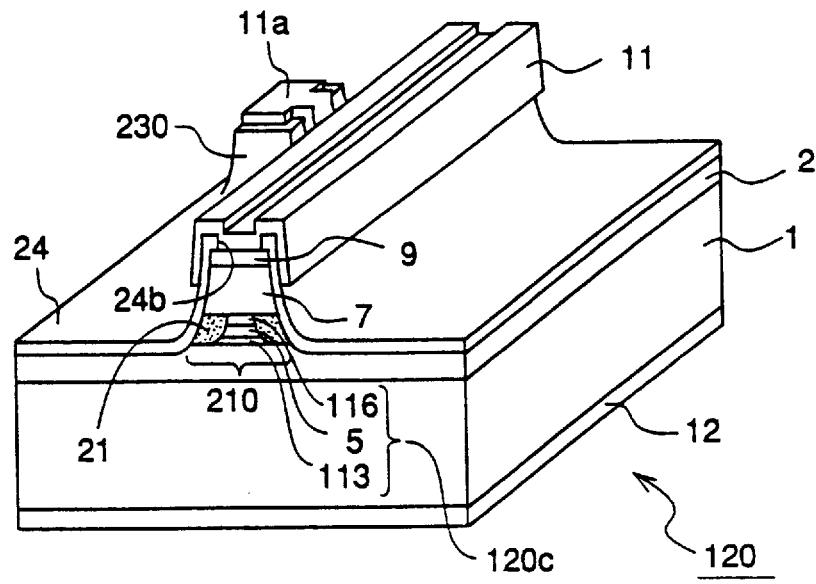
FIGS. 6(a) and 6(b) are a perspective view and a cross-sectional view, respectively, illustrating a field absorption type modulator according to a second embodiment of the invention.
Figure 6:
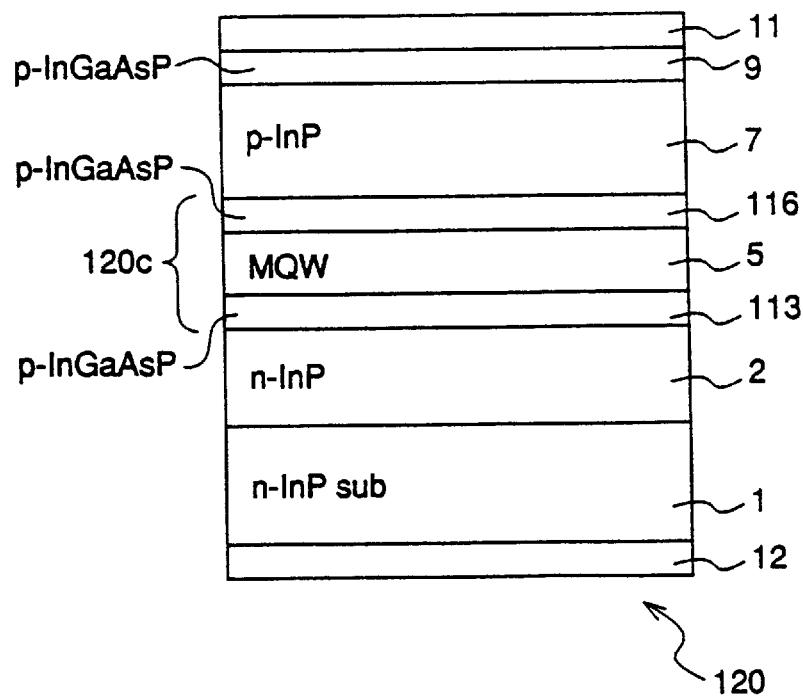
Figure 7:
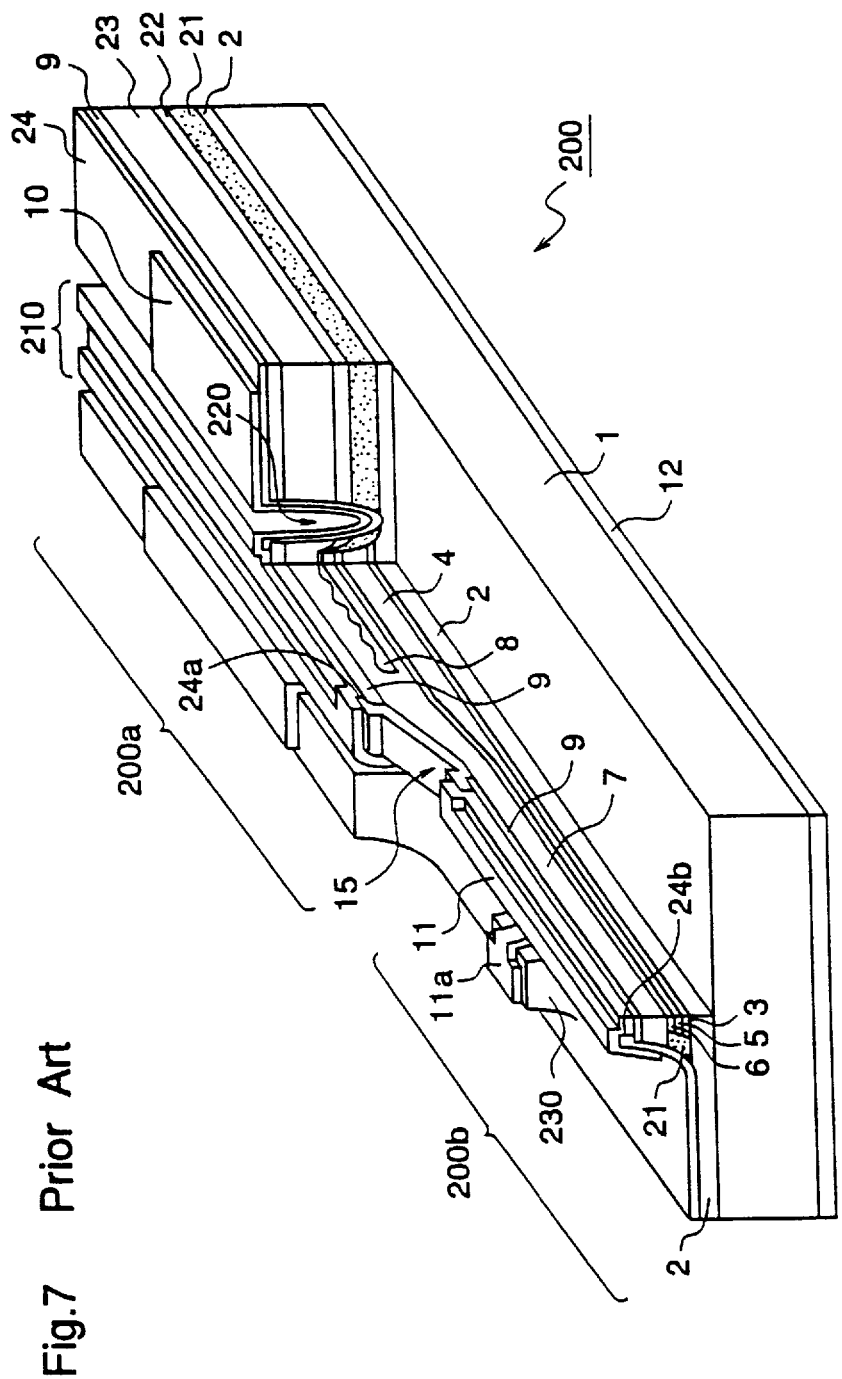
FIG. 7 is a perspective view, partly in section, illustrating an integrated semiconductor laser and modulator according to the prior art.
Figure 9:
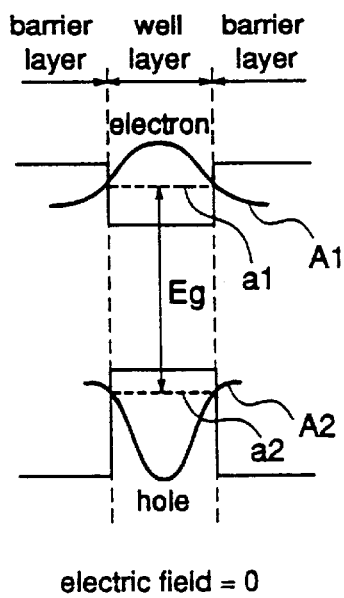
FIGS. 9(a) and 9(b) are diagrams for explaining the quantum confined Stark effect in the optical modulators according to the invention and the prior art, in the state where an electric field is generated in the quantum well (FIG. 9(a)) and in the state where no electric field is generated in the quantum well (FIG. 9(b)).
Figure 9:
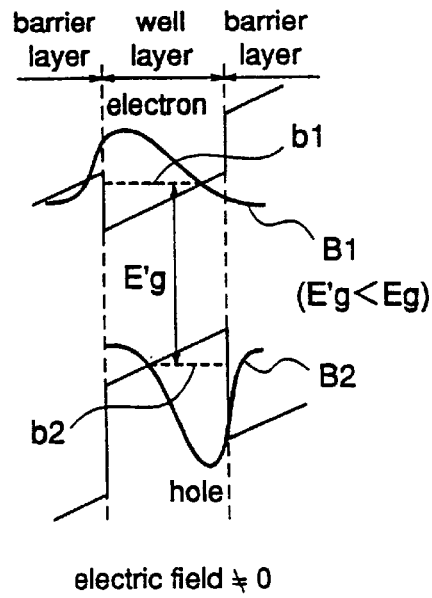
Figure 10:
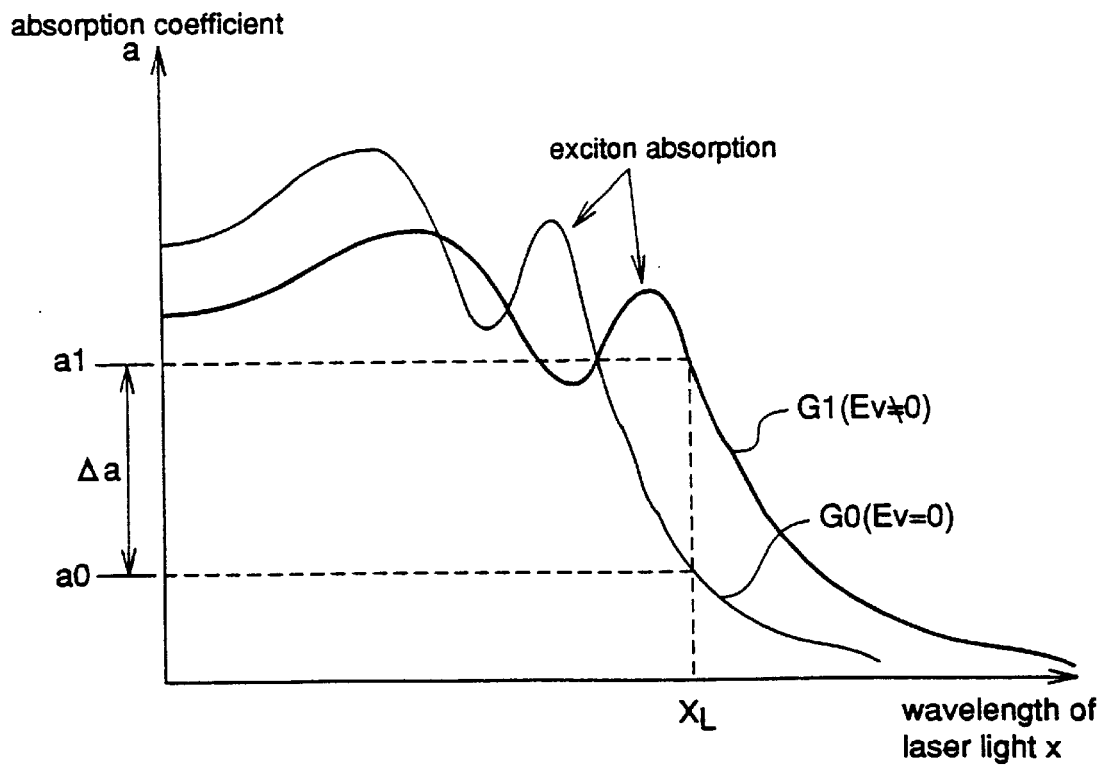
FIG. 10 is a diagram illustrating variations in absorption spectrum in response to applied voltage, in the MQW optical waveguide layer included in the prior art modulator.

FIG. 6(a) is a perspective view illustrating a light absorption modulator having a stripe-shaped ridge structure according to a second embodiment of the present invention, and FIG. 6(b) is a cross-sectional view thereof along the stripe-shaped ridge structure.

In these figures, reference numeral 120 designates a light absorption modulator according to this second embodiment, and this modulator 120 is identical to the modulator 110b included in the integrated semiconductor laser and modulator 110 according to the first embodiment.

More specifically, the modulator 120 employs an n type InP substrate 1. A p⁻ type InGaAsP light confinement layer 113, an MQW optical waveguide layer 5, and a p type light confinement layer 116 are disposed on the n type InP substrate 1. On both sides of the MQW optical waveguide layer 5 and the p type light confinement layers 113 and 116, Fe-doped semi-insulating InP current blocking layers 21 are disposed. A p type InP cladding layer 7 and a p type InGaAsP contact layer 9 are successively disposed on the p type light confinement layer 116 and on the InP current blocking layers 21. In this modulator 120, the layers 5, 7, 9, 21, 113, and 116 form a stripe-shaped ridge structure 210, and the MQW optical waveguide layer and the light confinement layers 113 and 116 provide an optical waveguide structure 120c.

The thicknesses and the carrier (or dopant) concentrations of the respective semiconductor layers mentioned above are identical to those of the semiconductor layers in the modulator 110b according to the first embodiment.

The top and side surfaces of the ridge structure 210 are covered with an insulating film 24, and the insulating film 24 has an opening 24b at the top of the ridge structure 210. A p side electrode 11 is disposed on the ridge structure 210, contacting the contact layer 9 through the opening 24b of the insulating film 24. Further, a projection 230 is formed in the vicinity of the ridge structure 210, and a bonding pad 11a is disposed on the projection 230. The bonding pad 11a and the p side electrode 11 are continuous and comprise a metal layer having a Ti/Pt/Au structure.

Further, an n side electrode 12 is disposed on the rear surface of the n type InP substrate 1. This n side electrode 12 has an Au/Ge/Ni/Au structure in which an Au layer, a Ge layer, an Ni layer, and an Au layer are disposed in this order from the rear surface of the substrate 1.

In the light absorption type modulator 120 so constructed, the optical waveguide structure 120c comprises the MQW optical waveguide layer 5 for guiding light and the light confinement layers 113 and 116 disposed on upper and lower sides of the waveguide layer 5 to confine light in the waveguide layer 5, and the lower light confinement layer 113 contacting the n type InP cladding layer 2 comprises p$^-$ type InGaAsP. Therefore, the electric field strength in the MQW optical waveguide layer 5 when no voltage is applied to the modulator 120 is reduced, whereby the rise time of the optical output of the modulator 120 is reduced.

Further, since the carrier concentration of the p$^-$ type light confinement layer 113 contacting the n type cladding layer 2 is larger than $1\times10^{17}$ cm$^{-3}$ and smaller than $1\times10^{18}$ cm$^{-3}$, it is possible to maintain a high electric field strength in the MQW optical waveguide layer 5 when a reverse bias is applied to the modulator 120 while suppressing the electric field strength in the MQW optical waveguide layer 5 when no reverse bias is applied to the modulator 120, whereby a large extinction ratio is realized.

Further, since the light confinement layer 116 on the MQW optical waveguide layer 5 comprises a p type semiconductor having a carrier concentration as high as $1\times10^{18}$ cm$^{-3}$, an electric field caused by the voltage applied to the modulator 120 is scarcely generated in the light confinement layer 116, whereby the extinction ratio is increased.

What is claimed is:

1. A light absorption modulator comprising:

a semiconductor substrate of a first conductivity type;

a first cladding layer of the first conductivity type disposed on the substrate;

an optical waveguide disposed on the first cladding layer and comprising a multiple quantum well optical waveguide layer through which light travels and first and second light confinement layers respectively disposed on opposed first and second surfaces of the optical waveguide layer for confining light in the optical waveguide layer; and a second cladding layer of a second conductivity type, opposite the first conductivity type, disposed on the optical waveguide wherein one of the first and second cladding layers is n type, the one of the first and second light confinement layers that contacts the n type cladding layer is p type, and light traveling through the optical waveguide layer is modulated by applying an electric field to the optical waveguide layer.

2. The light absorption type modulator of claim 1 wherein the p type light confinement layer contacting the n type cladding layer comprises InGaAsP and has a carrier concentration larger than $1\times10^{17}$ cm$^{-3}$ and smaller than $1\times10^{18}$ cm$^{-3}$.

3. An integrated semiconductor laser and modulator comprising:

a semiconductor substrate of a first conductivity type;

a laser producing laser light; and a light absorption modulator for modulating the laser light, the laser and modulator being monolithically integrated on the semiconductor substrate, wherein said light absorption modulator comprises:

a first cladding layer of the first conductivity type disposed on the substrate;

an optical waveguide disposed on the first cladding layer and comprising a multiple quantum well optical waveguide layer through which light travels and first and second light confinement layers respectively disposed on opposed first and second surfaces of the optical waveguide layer for confining light in the optical waveguide layer; and a second cladding layer of a second conductivity type, opposite the first conductivity type, disposed on the optical waveguide wherein one of the first and second cladding layers is an n type, the one of the first and second light confinement layers that contacts the n type cladding layer is p type, and light traveling through the optical waveguide layer is modulated by applying an electric field to the optical waveguide layer.

4. The integrated semiconductor laser and modulator of claim 3 wherein the p type light confinement layer contacting the n type cladding layer comprises InGaAsP and has a carrier concentration larger than $1\times10^{17}$ cm$^{-3}$ and smaller than $1\times10^{18}$ cm$^{-3}$.

* * * * *